United States Patent [19]

Schade, Jr.

[11] 4,274,014
[45] Jun. 16, 1981

[54] SWITCHED CURRENT SOURCE FOR CURRENT LIMITING COMPLEMENTARY SYMMETRY INVERTER

[75] Inventor: Otto H. Schade, Jr., N. Caldwell, N.J.

[73] Assignee: RCA Corporation, New York, N.Y.

[21] Appl. No.: 965,581

[22] Filed: Dec. 1, 1978

[51] Int. Cl.³ ............................................. H03K 17/60
[52] U.S. Cl. ..................................... 307/585; 307/279; 307/297; 307/451; 307/456
[58] Field of Search ............... 307/251, 215, 304, 279, 307/296, 297; 330/288

[56] References Cited

U.S. PATENT DOCUMENTS

| | | | |
|---|---|---|---|
| 3,651,840 | 3/1972 | Cliff | 307/251 |
| 3,886,464 | 5/1975 | Dingwall | 307/304 |
| 3,914,702 | 10/1975 | Gehweiler | 307/304 |
| 4,045,747 | 8/1977 | Hsu | 330/288 |
| 4,069,431 | 1/1978 | Kucharewski | 330/288 |

OTHER PUBLICATIONS

IEEE Journal of Solid-State Circuits, vol. SC6, No. 6, Gyrator Implementation with Integrable Conveyors, Black et al. 12/71, pp. 396–399.

Primary Examiner—Larry N. Anagnos
Assistant Examiner—B. P. Davis
Attorney, Agent, or Firm—A. L. Limberg; A. J. Jacobson

[57] ABSTRACT

A complementary symmetry inverter comprising two field effect transistors and a current mirror amplifier. A constant bias current is supplied to the master path of the current mirror amplifier. The slave path of the current mirror amplifier and one of said field effect transistors are connected to form a switched current source in series with the other of said transistors. The switched current source limits the peak value of the switching current pulse in the inverter in fixed relation to the current in the master path of the current mirror amplifier when the inverter switches between logic states. The switched current source also limits the current between the inverter output and an external device.

9 Claims, 8 Drawing Figures

SWITCHED CURRENT SOURCE FOR CURRENT LIMITING COMPLEMENTARY SYMMETRY INVERTER

This invention relates to current limiting, and more particularly to arrangements for limiting the peak switching current in a complementary symmetry inverter.

Complementary symmetry circuits are well known. A typical complementary inverter comprises a transistor of one type of conductivity type connected in series with a transistor of the opposite conductivity type and connected to a suitable voltage source. The control electrodes of each transistor are wired together as an input terminal. The connection between the two transistors is the output terminal.

Complementary symmetry structures are attractive as logic circuits because they use relatively little power. For example, a complementary symmetry inverter using insulated gate transistors would include one P-channel transistor and one N-channel transistor. When the P-channel transistor is turned on, the N-channel transistor is turned off, and vice versa. Therefore in the quiescent state only a very small current flows, equal to the leakage current of either transistor in the off state.

While complementary symmetry structures draw very little current in the quiescent state, somewhat greater current is drawn during switching. In the case of insulated gate transistors, or metal oxide semiconductor (MOS) transistors, there is a range of input voltages for which both transistors are partially on. This operating range may be termed the analog region. As the input voltage changes from one logic level to the other, the current drawn by the inverter will increase, rise to a peak value, and then decrease again to its quiescent value. Thus the power consumed by the inverter is generally related to the amount of time the input signal dwells in the analog region. When the inverter is used as a logic element it can be seen that power consumption is related to switching frequency.

Under certain operating conditions the total integrated current, or power, drawn by the inverter can be excessive. For example, when the inverter is used as a comparator, and the input signal is slowly changing, currents near the peak current may be drawn for an excessive length of time. If the geometry of the P-channel and N-channel devices are unequal, a technique used to shift the switching point away from midrange, still higher peak currents will be drawn. Also, the inverter may be used to source or sink current to an external load. In any case, it is desirable to limit inverter current, both internal peak switching current and external output current, to a low predetermined value.

One attempt to deal with the problem of limiting the peak switching current in complementary symmetry amplifiers may be found in U.S. Pat. No. 3,651,340 to Cliff. In that patent, peak current is limited by placing an impedance in series with the power supply to the inverter. The impedance may be a resistor or a forward biased diode.

The present invention comtemplates a switched current source for current limiting complementary symmetry inverters. The current source is a current mirror amplifier connected in series with the inverter and switched by one of the devices of the inverter. In addition to limiting peak switching current, the switched current source also limits output current in one direction. In another embodiment, two switched current sources are employed in a symmetrical circuit. The symmetrical circuit has the particular advantage that, in addition to limiting the peak current pulse, the switching point of the inverter may be controlled by proper selection of transistor device geometry. Also, as a result of the symmetry, output current is limited in both directions.

Figure 1:
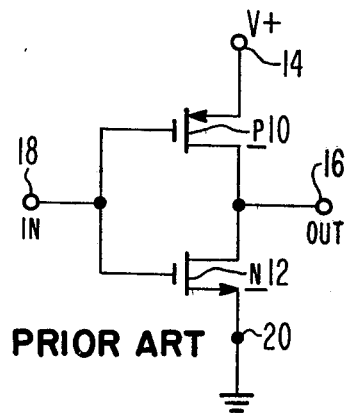
FIG. 1 is a schematic diagram of the basic complementary symmetry inverter.

A basic complementary symmetry inverter using insulated-gate transistors is shown in FIG. 1. The upper transistor P10 is a P-channel enhancement type MOS transistor. The lower device N12 is an N-channel enhancement type MOS transistor. Terminals 14 and 20 are power supply terminals for receiving a pair of operating potentials shown as V+ and ground, respectively. While FIG. 1 shows terminal 20 as a common ground reference it will be understood that terminal 20 could be any positive or negative voltage so long as the resulting potential difference between voltages on terminals 14 and 20 is within the active operating range of the MOS transistors.

When the input terminal 18 is low—e.g., at ground potential or zero volts—transistor N12 is conditioned for non-conduction and transistor P10 is conditioned for conduction. The output 16 is therefore high, being nearly equal to the +V operating potential. When the input 18 is high—e.g., at the +V operating potential, transistor P10 is off and transistor N12 is on, forcing the output 16 close to ground. The circuit of FIG. 1 therefore operates as a digital inverter.

Figure 3:
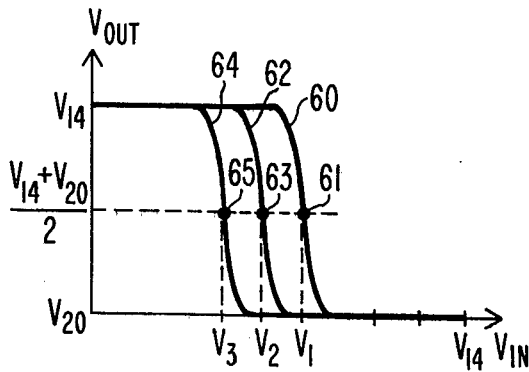
FIG. 3 is a multiple graph showing various transfer characteristics for the inverter shown in FIG. 1.

The transfer characteristics of the inverter in FIG. 1 is shown by curve 60 in the plot in FIG. 3. For low values of input voltage the output voltage is essentially equal to the supply voltage. As the input voltage is increased, a point is reached where the output voltage begins to fall. As the input voltage is increased still further, the output voltage falls to essentially zero volts and remains at zero volts as the input voltage is increased still further. The midpoint 61 of curve 60 is defined as the switching point. It represents the value of input voltage which will force the inverter output to a value midway between the +V and ground operating potentials. The narrow region about point 61 where the curve steeply falls from one voltage level to the other is the analog region of the inverter.

The operating transfer characteristics of the basic inverter of FIG. 1 suggest its use as a digital logic element. The extremely narrow analog region is desirable in a digital inverter because of the resulting high noise immunity. The basic inverter may also be used as a comparator which will switch states when the input signal rises above a predetermined point, i.e., the switching point 61.

Although the basic inverter draws very little current while in a quiescent state, the inverter will draw a much larger current while switching from one state to the other. This may be seen by considering the graph shown in FIG. 4. The horizontal axis represents the gate-to-source voltage of either of the transistors shown in FIG. 1. The vertical axis indicates the drain current drawn through the transistor. Curve 60a is the voltage current characteristics of the P-channel upper transistor P10 (FIG. 1). Curve 66 is the voltage-current characteristics of the lower N-channel device N12 plotted as a load line. If all devices in this circuit have matched characteristics, and the geometries of both transistors P10 and N12 are equal, then the intersection of curves 60a and 66 will be at a voltage $V_1$ midpoint between the voltage supply and zero volts. Also, since transistors P10 and N12 are in series, the intersection of curve 60a and 66 represents the peak current drawn during switching. Thus it can be seen that as the input voltage on terminal 18 changes from zero volts to the supply voltage, the current drawn on the inverter will gradually increase, rise to a peak value, and then decrease to its quiescent state.

Figure 4:
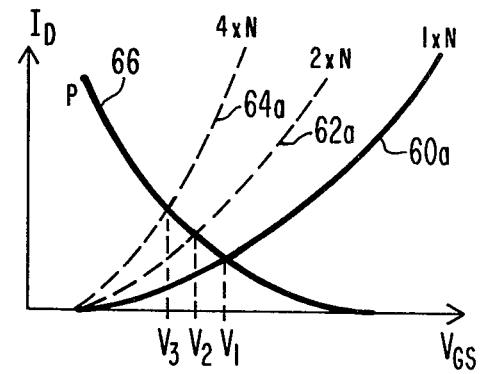
FIG. 4 is a multiple graph of drain current versus gate voltage for each of the inverter transistors shown in FIG. 1.

In using the circuit of FIG. 1 as a comparator, it may be desirable to shift the switching point to a level near +V or ground. One way of shifting the switching point is to make the geometries of the upper and lower devices unequal. The curve 62a in FIG. 4 represents the voltage-current characteristics of a lower N-channel transistor device that is twice as large as the device represented by the curve 60a. That is, the width-to-length ratio of the channel of second transistor is twice that of the first transistor. As can be seen in FIG. 4, the switching voltage has shifted to the left, to a value $V_2$. Also, note that the peak switching current has increased somewhat as well. The switching point of the inverter can be shifted still further to the left by making the lower device four times the size of the upper device as shown by curve 64a. Again, while the switching voltage has shifted to a lower value, the peak switching current has again increased. The transfer characteristics for inverters represented by curves 62a and 64a are depicted in FIG. 3 as curves 62 and 64, respectively.

Figure 2:
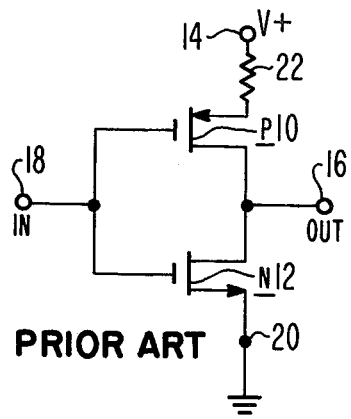
FIG. 2 is a schematic diagram of a prior art circuit using a series impedance to limit peak switching current pulses.

Peak current drawn during switching is a major cause of power consumption in complementary symmetry devices. One attempt to reduce the power consumption caused by switching currents is shown in FIG. 2. An impedance 22 which can be a resistor or a forward biased diode is inserted in series with the power supply. When transistors P10 and N12 are both in the on state during switching, impedance 22 will limit the current drawn from the supply.

Figure 5:
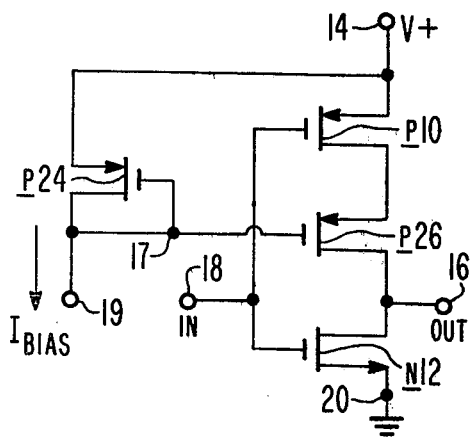
FIG. 5 shows an embodiment of the present invention using P-channel field effect transistors.

The present invention uses a switched current source interposed between the drain of one of the transistors and the output terminal to limit the peak switching current to a predetermined value. The switched current source is a current mirror amplifier in conjunction with one of the devices of the inverter. Referring to FIG. 5 transistors P24 and P26 comprise the current mirror amplifier and transistor P10 is used in conjunction with the current mirror amplifier to comprise a switched current source.

As used herein, the term current mirror amplifier means a linear inverting current amplifier of the kind comprising: current-to-voltage converter means responsive to the amplifier input current for producing a voltage; a voltage-to-current converter means responsive to said voltage for producing the amplifier output current and wherein each converter means exhibits a respective current/voltage characteristic, which may be non-linear, said characteristics being related by a factor G independent of the magnitude of the current being amplified and being selected to track each other with changes in temperature for providing an overall amplifier gain wherein the ratio of output current to input current magnitudes equals the factor G over substantial ranges of both temperature and the magnitude of the amplified current.

To understand the operation of the circuit of FIG. 5, first assume that transistor P10 is in a conducting state approximating a short circuit. Under these circuit conditions it can be seen that transistors P24 and P26 comprise a conventional current mirror amplifier. A bias current is supplied to node 19 and flows to terminal 14 through transistor P24, providing the master path of the current mirror amplifier. Since the gate and drain of transistor P24 are connected in common, the device will act like a diode. The voltage on node 17 is also the voltage on the gate of transistor P26. Transistor P26 provides the slave path of the current mirror amplifier. For proper operation, the two transistors of a current mirror amplifier should have tracking characteristics. This is accomplished by concurrently forming both transistors on a common substrate by the same manufacturing process steps. If transistors P24 and P26 have the same characteristics, then the voltage on the gate of transistor P24 will produce a current in transistor P26 which is in constant proportion to the current through transistor P24. Thus, as the inverter transistors P10 and N12 switch between states the maximum current in the inverter is limited in fixed relation to the bias current through transistor P24.

Figure 6:
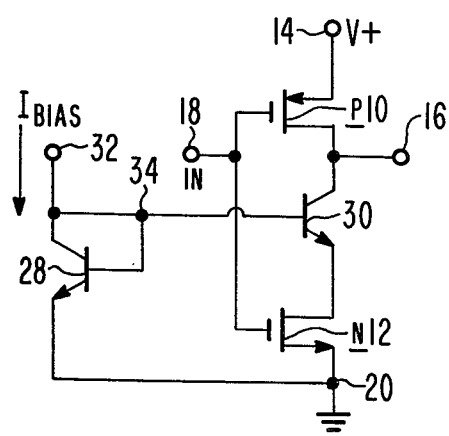
FIG. 6 shows a second embodiment of the present invention using NPN bipolar transistors.

An alternate embodiment of the present invention using NPN bipolar transistors is shown in FIG. 6. It should be apparent from examination and comparison of FIGS. 5 and 6 that the present invention may be practised using field effect transistors or bipolar transistors of either conductivity type as the mirroring transistors.

In FIG. 6 a bias current is supplied to the master path of the current mirror amplifier through transistor 28. The slave path through transistor 30 is in series with the inverter circuit to limit the peak current therein. The bipolar embodiment of FIG. 6 operates in a similar fashion to the MOS embodiment of FIG. 5 except that transistors 28 and 30 draw non-zero base currents, whereas MOS transistors P24 and P26 in FIG. 5 draw essentially zero gate currents. The bias current (FIG. 6) will bear a fixed relationship to the peak current in the slave path 30, but will be slightly offset by the sum of the base currents drawn by transistors 28 and 30. Again, similar to the MOS version of the circuit, transistors 28 and 30 should have tracking base-emitter junction characteristics in order to function as a current mirror amplifier.

To review the operation of the circuit shown in FIG. 6, first assume that transistor N12 is in a conducting state, approximating a short circuit. Further, assume the base-emitter current of transistor 30 is of a value $I_b$. Assuming transistors 28 and 30 have matched characteristics, the base emitter current of transistor 28 will also equal $I_b$. This means that the bias current into node 32 will equal $\beta I_b + 2I_b$. The current through transistor 30, the slave path of the current mirror amplifier, will equal $\beta I_b$ (assuming the $\beta$ for transistors 28 and 30 are equal). The ratio between the current in the master path to the current in the slave path is therefore $(\beta + 2)/\beta \cdot \beta$ is normally quite large, typically in excess of 30, so $(\beta + 2)/\beta$ approaches unity. The current in this slave path is the maximum current that can flow in the inverter amplifier. Therefore, during switching of the inverter while transistors P10 and N12 are on, the peak switching current may not exceed an amount as mentioned above, in fixed relation to the bias current supplied to node 32.

The bias current supplied to the master path of the current mirror amplifier in either FIG. 5 or FIG. 6 can simply be a voltage source and a resistor. The resistance can be an external discrete element or may be fabricated on the same substrate as the inverter.

As previously mentioned, the switching point of the basic logic inverter (FIG. 1) may be shifted away from midrange by making the geometry of the upper and lower devices unequal. Looking at the curves plotted in FIG. 3, the switching point is defined as the input voltage for which the output is one-half the supply voltage. If the upper and lower devices are equal in size and operating characteristics, the switching point will be about in the middle. If the upper transistor is made large compared to the lower transistor, the switching point will be near the $+V$ operating potential and conversely for larger lower transistors.

Circuits employing a switched current source such as shown in FIGS. 5 and 6 are readily designed to have a switching point shifted very close to either the $+V$ operating potential (FIG. 6) or to ground (FIG. 5). For instance, in FIG. 5, the switching point is approximately equal to the threshold voltage of transistor N12 and in FIG. 6 the switching voltage is approximately the positive supply minus the threshold voltage of transistor P10.

In FIG. 5, when input voltage at 18 is below the threshold voltage, transistor N12 is off, making output terminal 16 high. As the input voltage is increased beyond its threshold voltage, transistor N12 begins to conduct current. The input voltage then increases sufficiently to cause transistor N12 to conduct $I_{bias}$. This will occur just slightly above threshold, since $I_{bias}$ is presumably limited to a low value. The output is now low. As the input voltage is increased still further, transistor N12 is driven further into saturation. However, no further increases in current occur because transistor P26, the slave path of the current mirror acts as a current source limiting the current to $I_{bias}$. The inverter transistor P10 functions as a switch which turns the current source transistor P26 on and off.

The reverse process occurs when the input voltage swings from high to low. The output is initially low as transistor N12 is on and transistor P10 is off. As the input voltage is lowered, transistor P10 turns on. This action will switch on the current source (transistor P26) resulting in an inverter current of $I_{bias}$. Since transistor N12 is still on, and able to conduct in excess of $I_{bias}$, the output is low. Only when the input is reduced below that gate voltage necessary for transistor N12 to conduct $I_{bias}$, will the output go high. Thus, it is seen that the switching point is shifted to approximately a threshold voltage from ground.

An analysis similar to the foregoing applies to the bipolar circuit of FIG. 6, wherein the switching point is approximately a threshold voltage away from the $+V$ operating potential.

From the foregoing it is seen that the above circuits are useful when the desired switching point is close to either $+V$ or ground. The switching point may be shifted slightly by controlling threshold voltage or device size. In the circuit of FIG. 6, if the threshold voltage is made smaller or the upper device P10 made larger, the switching point will shift closer to $+V$. However, the switching point cannot be shifted appreciably by controlling threshold voltage or device sizes.

If it is desired to shift the switching point to a predetermined voltage, it is possible to change the $+V$ operating potential so that the switching point is set at any chosen voltage level.

Inserting a switched current source in one side of the inverter creates an unsymmetrical circuit. As might be expected, the resulting voltage transfer characteristic is unsymmetrical, or shifted. An unexpected result, however, is that a single current source limits peak switching current regardless of switching direction. This is so because the current source is in series with the inverter transistors. Even if both inverter transistors were fully conductive, the inverter current could be no greater than the preset current in the slave path of the current mirror amplifier. Therefore, the peak current in the inverter is limited as described above regardless of whether the inverter is switching from high to low or low to high.

When the inverter is used to drive an external load, the output current will be limited in the same manner as switching current is limited. However, the output current limiting is not symmetrical. For the circuit of FIG. 5, any source current will be limited to $I_{bias}$, but sink current will not. Conversely, for the circuit of FIG. 6, any sink current will be limited to $I_{bias}$, but source current will not.

Figure 7:
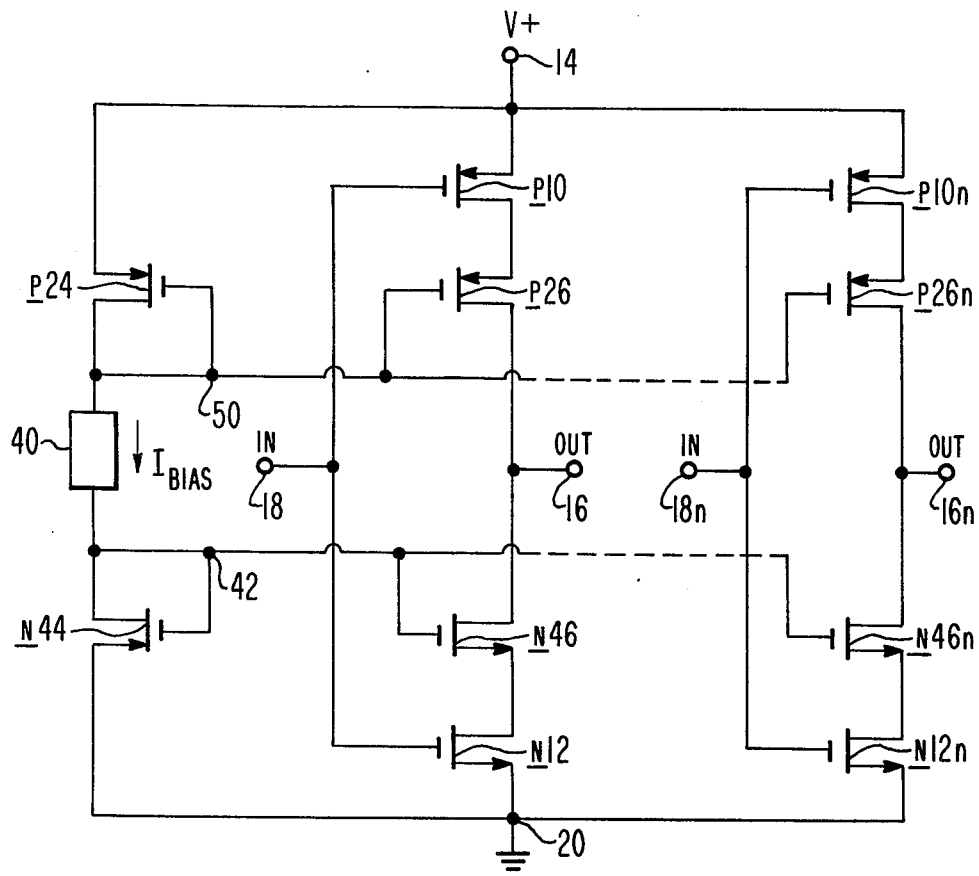
FIG. 7 shows a third embodiment of the invention employing two switched current sources.

A symmetrical circuit using two switched current sources is shown in FIG. 7. The symmetrical circuit, in addition to limiting peak switching current, will limit output current in both directions. That is, both source and sink currents will be limited to $I_{bias}$.

In the circuit of FIG. 7, a bias current is provided by simply using the supply voltage and an impedance 40. The impedance 40 may be a resistor, either internal or external to the chip. As shown, a single impedance is used to supply equal but opposite constant bias currents to the upper and lower current mirror amplifiers.

Of particular interest is the determination of the switching point in the symmetrical circuit of FIG. 7. Theoretically, if all devices have matched transfer characteristics and upper transistors P10, P26, P24 are the same sizes as lower transistors N12, N46, N44, respectively, the switching point will be approximately midrange. If either of the upper devices, P10 or P26, is made larger, the switching point will shift more positive (towards the $+V$ operating potential). Conversely, if transistor N12 or N46 is made the larger, the switching point will shift less positive and closer to ground. By adjustment of device sizes, the switching point can be set at any convenient level. Since the slave paths are in series, the peak switching current is limited to smaller current of the two switched current sources. Note that the shifting of the switching point by making device geometry unequal does not increase the peak switching current.

As a practical matter, a very slight imbalance between upper and lower devices will shift the switching point all the way to one side or the other. This is because process and material parameters cannot be controlled closely enough at the present time. In order to avoid any indeterminacy in the switching point it is best to deliberately imbalance the upper and lower devices to overcome normal process variations.

The circuit of FIG. 7 may be implemented using bipolar transistors. For example, P24 and P26 could be PNP bipolar transistors and N44 and N46 would be NPN bipolar transistors.

When more than one inverter is constructed on the same chip it is not necessary to provide a separate current mirror for each inverter. One plural-output current mirror can serve a plurality of slave paths, each responsive to a single bias current flowing in its master path. This is illustrated in FIG. 7 where the voltage at nodes 50 and 42 control the slave transistors P26n and N46n in a second inverter comprising transistors P10n and N12n.

Figure 8:
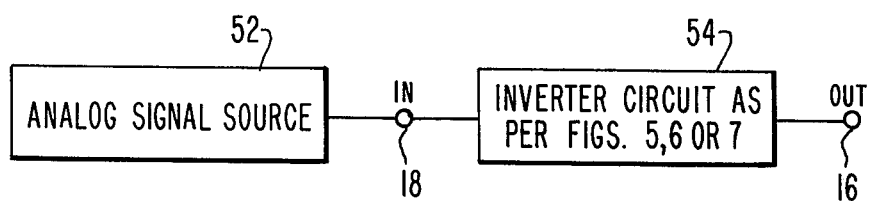
FIG. 8 is a block diagram of an application of the present invention used as a comparator.

An application of the present invention is shown in FIG. 8. Here, the inverter 54 functions as a digital comparator. Assume that the switching point of the inverter 54 has been set at a predetermined point as previously discussed. Analog signal source 52 is connected to the inverter input 18 as shown. The inverter 54 can be the inverter of FIG. 5, 6 or 7. The output 16 of the inverter 54 will be low when the analog signal is above the predetermined switching point, and will be high when the input is below the switching point. The peak current drawn by the inverter, however, is limited to a low value (equal to $I_{bias}$, as set in the inverter) even if the analog signal is slowly changing and lingers about the switching point. Furthermore, the preset value of $I_{bias}$ is the maximum switching current regardless of device size differences within the inverter.

What is claimed is:

1. A switched current source for selectively supplying load means a predetermined level of output current in response to a first level of a binary-signal control voltage and for completely interrupting the supplying of output current responsive to a second level of control voltage, said switched current source comprising:

first and second and third transistors, of similar conductivity type, each having respective first and second electrodes that define the ends of its respective principal current conduction path and having respective third electrode, the potential between its first and third electrodes controlling the conduction of its principal current conduction path, said first and second transistors requiring voltages between their first and third electrodes that exceed substantially equal threshold values for conditioning each of them to conduct between its first and second electrodes;

a first terminal for receiving a first operating potential to which the first electrodes of said first and third transistors connect without substantial intervening impedance;

a second terminal for receiving said control voltage at the third electrode of said third transistor, a first level of said control voltage conditioning said third transistor for conduction between its first and second electrodes and a second level of said control voltage conditioning said third transistor for non-conduction between its first and second electrodes;

a third terminal connecting to said load means for conducting said output current, to which third terminal the second electrode of said second transistor connects; and means connecting said first and second transistors for functioning as a current mirror amplifier whenever said third transistor conducts between its first and second electrodes, to constrain said output current to a prescribed level proportional to a first bias current, that means additionally including a connection without substantial intervening impedance between the first electrode of said second transistor and the second electrode of said third transistor, means for supplying said first bias current to a first node to which the second electrode of said first transistor connects, and means direct coupling said first node to an interconnection between the third electrodes of said first and second transistor for completing a direct coupled feedback loop that conditions said first transistor to conduct substantially all of said first bias current through its principal current conduction path.

2. A switched current source as set forth in claim 1 arranged in combination with the following elements for providing an inverter amplifier for binary-signal:

a fourth transistor having complementary conductivity characteristics to said third transistor, having first and second electrodes that define the ends of its principal current conduction path, and having a third electrode connected to said second terminal, the potential between its first and third electrodes controlling the conduction of its principal current conduction path, a fourth terminal for receiving a second operating potential to which the first electrode of said fourth transistor connects, said reference voltage being such that said fourth transistor is conditioned for non-conduction by said first level of control voltage and for conduction by said second level of control voltage; and means for connecting the second electrode of said fourth transistor to said third terminal.

3. An inverter amplifier as set forth in claim 2 wherein said means for connecting the second electrode of said fourth transistor to said third terminal consists of a direct connection without substantial intervening impedance.

4. An inverter amplifier as set forth in claim 2 wherein said means for connecting the second electrode of said fourth transistor to said third terminal includes:

fifth and sixth transistors of similar conductivity type to said fourth transistor, each having respective first and second electrodes that define the ends of its respective principal current conduction path and having a respective third electrode, the potential between its first and third electrodes controlling the conduction of its principal current conduction path, said fifth and sixth transistors requiring voltages between their first and third electrodes that exceed substantially equal threshold values for conditioning each of them to conduct between its first and second electrodes; and means connecting said fifth and sixth transistors for functioning as a current mirror amplifier whenever said fourth transistor conducts between its first and second electrodes, that means additionally including a connection without substantial intervening impedance between the second electrode of said fourth transistor and the first electrode of said sixth transistor, a connection without substantial intervening impedance between the second electrode of said sixth transistor and said third terminal, a connection without substantial intervening impedance between the first electrode of the fifth transistor and said fourth terminal, means for supplying a second bias current, of opposite polarity to said first bias current, to a second node to which the second electrode of said fifth transistor connects, and means direct coupling said second node to an interconnection between the third electrodes of said fifth and sixth transistors for completing a direct coupled feedback loop that conditions said fifth transistor to conduct substantially all of said second bias current through its principal current conduction path.

5. An inverter amplifier as set forth in claim 4 wherein said means for supplying a first bias current and said means for supplying a second bias current together comprise:

a single two-terminal current generator means having a first terminal thereof connected to said first node for supplying said first bias current and having a second terminal thereof connected to said second node for supplying said second bias current, said first and second bias currents thereby being of equal amplitude and opposite polarity.

6. A complementary symmetry inverter comprising:

first and second field effect transistors of opposite conductivity types, each of said transistors having gate, drain, and source electrodes respectively;

a first terminal for receiving a first operating potential, the source of the first transistor being connected to said first terminal;

a second terminal for receiving a second operating potential, the source of the second transistor being connected to said second terminal;

an input terminal to which the gates of said transistors are connected in common, said input terminal being suitable for receiving a control voltage, a first level of said control voltage conditioning said first transistor for conduction between its source and drain electrodes and conditioning said second transistor for nonconduction between its source and drain electrodes, a second level of said control voltage conditioning said first transistor for nonconduction between its drain and source electrodes and conditioning said second transistor for conduction between its source and drain electrodes;

an output terminal to which the drain electrode of said second inverter transistor is connected;

a current mirror amplifier having a master path and a slave path, the slave path connected to conduct current between the drain of said first field-effect transistor and said output terminal whenever said first field-effect transistor conducts between its drain and source electrodes, the peak current in said slave path being limited in fixed relation to the current in said master path; and current control means for controlling the level of current flow through said master path of said current mirror amplifier.

7. An inverter according to claim 6 wherein said current mirror amplifier comprises:

a third field effect transistor of the same conductivity type as said first inverter transistor, having gate, source, and drain electrodes, the source of said third transistor being connected to the drain of said first inverter transistor, the drain of said third transistor being connected to said output terminal; and a fourth field effect transistor of the same conductivity type as said third transistor, having gate, source, and drain electrodes, said third and fourth transistors requiring voltages between their gate and source electrodes that exceed substantially equal threshold voltages for conditioning each of them to conduct between its drain and source electrodes, the source of said fourth transistor being connected to said first terminal, the drain of said fourth transistor being connected in common with the gates of said third and fourth transistors to form a circuit node for receiving a bias current from said current control means.

8. An inverter according to claim 6 wherein said current mirror amplifier comprises:

a first bipolar transistor, having base, emitter, and collector electrodes, said base being of the opposite conductivity type as the channel of said first inverter transistor, the emitter of said first bipolar transistor being connected to the drain of said first inverter transistor, the collector of said first bipolar transistor being connected to said output terminal; and a second bipolar transistor of the same conductivity type as said first bipolar transistor, having base, emitter, and collector electrodes, the emitter of said second bipolar transistor being connected to said first terminal, the collector of said second transistor being connected in common with the base electrodes of said first and second bipolar transistors to form a circuit node for receiving a bias current from said current control means.

9. A complementary symmetry inverter comprising:

first and second field effect transistors of opposite conductivity types, each of said inverter transistors having gate, drain, and source electrodes respectively;

a first terminal for receiving a first operating potential, the source of the first transistor being connected to said first terminal;

a second terminal for receiving a second operating potential, the source of the second transistor being connected to said second terminal;

an input terminal to which the gates of said transistors are connected in common, said input terminal being suitable for receiving a control voltage, a first level of said control voltage conditioning said first transistor for conduction between its source and drain electrodes and conditioning said second transistor for non-conduction between its source and drain electrodes, a second level of said control voltage conditioning said first transistor for non-conduction between its drain and source electrodes and conditioning said second transistor for conduction between its source and drain electrodes;

an output terminal;

a first current mirror amplifier having a first master path and a first slave path, the first slave path connected to conduct current between the drain of said first inverter transistor and said output terminal whenever said first inverter transistor conducts between its source and drain electrodes, the peak current in said first slave path being limited in fixed relation to the current in said first master path;

a second current mirror amplifier having a second master path and a second slave path, the second slave path connected to conduct current between the drain of said second inverter transistor and said output terminal whenever said second inverter transistor conducts between its source and drain electrodes, the peak current in said second slave path being limited in fixed relation to the current in said second master path;

first and second current control means for controlling the level of current through said respective first and second master paths of said respective first and second current mirror amplifiers.

* * * * *